(12) United States Patent
Lee

(10) Patent No.: US 9,721,987 B2
(45) Date of Patent: Aug. 1, 2017

(54) PIXEL WITH TRANSISTOR GATE COVERING PHOTODIODE

(71) Applicant: Taiwan Semiconductor Manufacturing CO., LTD., Hsinchu (TW)

(72) Inventor: Yueh-Chuan Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/170,926

(22) Filed: Feb. 3, 2014

(65) Prior Publication Data

US 2015/0221696 A1    Aug. 6, 2015

(51) Int. Cl.
*H01L 31/102* (2006.01)
*H01L 27/146* (2006.01)

(52) U.S. Cl.
CPC .... *H01L 27/14643* (2013.01); *H01L 27/1461* (2013.01); *H01L 27/1463* (2013.01); *H01L 27/14614* (2013.01); *H01L 27/14636* (2013.01); *H01L 27/14689* (2013.01)

(58) Field of Classification Search
CPC ................. H01L 31/105; H01L 31/115; H01L 27/14643; H01L 27/1461; Y02E 10/50; B82Y 10/00; G01N 27/414
USPC ............ 257/414, 428, 458, 431; 438/48, 57
See application file for complete search history.

(56) References Cited

U.S. PATENT DOCUMENTS

| | | | |
|---|---|---|---|
| 7,288,788 B2* | 10/2007 | Ellis-Monaghan | H01L 27/14601 257/225 |
| 7,391,084 B2* | 6/2008 | Arnborg | H01L 29/4983 257/285 |
| 7,656,000 B2 | 2/2010 | Hsu et al. | |
| 7,888,156 B2* | 2/2011 | Ellis-Monaghan | H01L 27/14601 257/E31.073 |
| 7,888,715 B2* | 2/2011 | Ahn | H01L 27/14603 257/292 |
| 7,999,342 B2 | 8/2011 | Hsu et al. | |
| 2005/0151867 A1* | 7/2005 | Goto | H04N 5/3741 348/302 |
| 2006/0071257 A1* | 4/2006 | Kang | 257/295 |
| 2006/0249764 A1* | 11/2006 | Huang | H01L 27/14689 257/291 |
| 2007/0075337 A1* | 4/2007 | Jung | H01L 27/14603 257/215 |

(Continued)

*Primary Examiner* — Lex Malsawma
*Assistant Examiner* — Eric Jones

(57) ABSTRACT

The semiconductor device includes a semiconductor substrate, an isolation feature, a photodiode and a transistor gate. The isolation feature is disposed in the semiconductor substrate. The photodiode is disposed in the semiconductor substrate and adjacent to the isolation feature. The photodiode includes a first pinned photodiode (PPD) with a first dopant type and a second PPD with a second dopant type. The second PPD is embedded in the first PPD, and is different from the first dopant type. The transistor gate is disposed over the photodiode and includes a first portion and a second portion. The first portion with the first dopant type is used for controlling the operation of the semiconductor device. The second portion with the second dopant type is adjacent to the first portion. The second portion covers the photodiode and extends toward the isolation feature.

20 Claims, 8 Drawing Sheets

(56) References Cited

U.S. PATENT DOCUMENTS

| | | | |
|---|---|---|---|
| 2007/0243676 A1* | 10/2007 | Sze ............................... | 438/197 |
| 2007/0267666 A1* | 11/2007 | Park et al. .................... | 257/292 |
| 2008/0111170 A1* | 5/2008 | Kim et al. .................... | 257/292 |
| 2009/0180010 A1* | 7/2009 | Adkisson et al. ............ | 348/294 |
| 2009/0278181 A1* | 11/2009 | Tanaka et al. ................ | 257/292 |
| 2010/0314667 A1* | 12/2010 | Nozaki ............. | H01L 27/14609 257/225 |
| 2012/0043589 A1* | 2/2012 | Nozaki et al. ................ | 257/225 |
| 2013/0248938 A1* | 9/2013 | Buettgen ........... | H01L 27/14603 257/229 |

* cited by examiner

PIXEL WITH TRANSISTOR GATE COVERING PHOTODIODE

BACKGROUND

Complementary Metal-Oxide-Semiconductor (CMOS) image sensors (CIS) are used in numerous applications including digital still cameras. In semiconductor technologies, image sensors are used for sensing exposed lights projected towards a semiconductor substrate. Generally, CIS products include a pixel (or pixel array) region and a periphery region. These products utilize an array of active pixels (i.e., image sensor elements or cells) including photodiodes and other elements (e.g., transistors) to convert images into digital data or electrical signals. Each of the photodiodes includes a p-type pinned photodiode and a n-type pinned photodiode to form a pn junction for transforming photons into electrons. Dark current (DC) and white pixel (WP) performance of the photodiodes are affected by various factors.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1A:
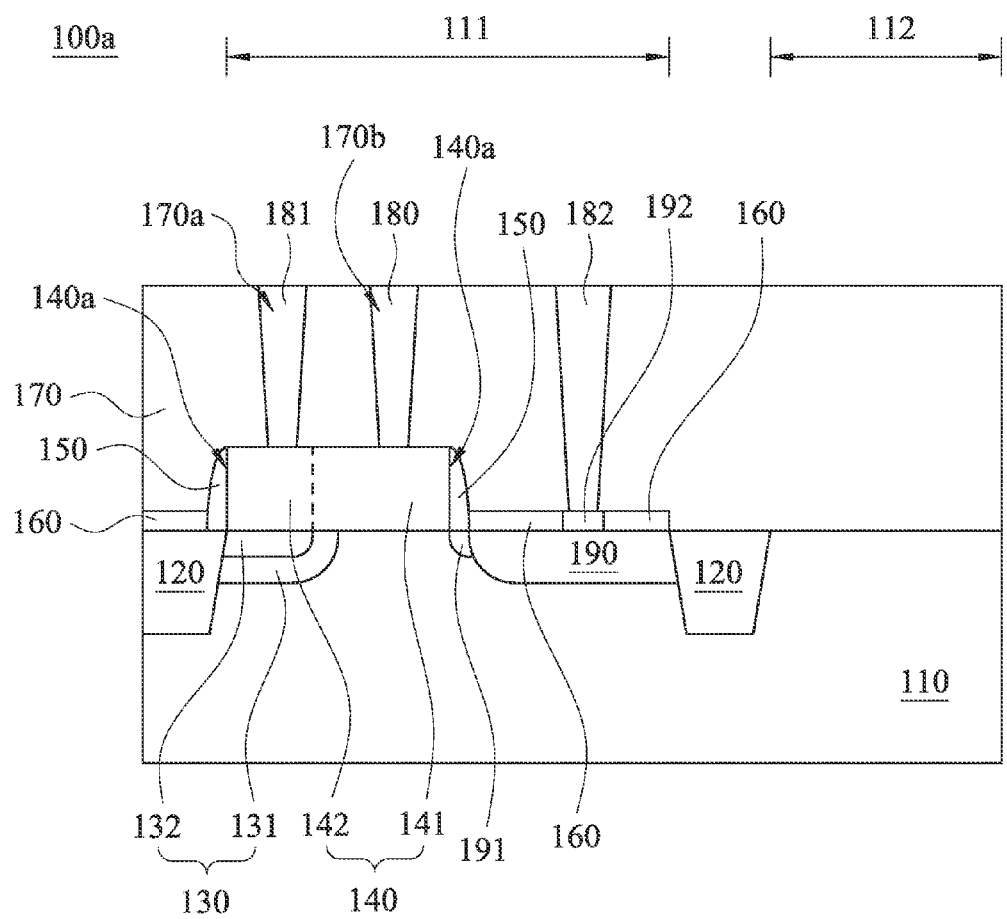
FIG. 1A is a schematic cross-sectional diagram of showing a semiconductor device in accordance with some embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

In general, an imperfect surface of a photodiode formed in a semiconductor substrate may degrade the DC or WP performance. In a conventional process, some operations may damage the surface of the photodiode. For example, a transistor gate is formed over a photodiode. The transistor gate is formed by forming an oxide layer and a poly gate (such as formed from silicon oxide and poly silicon, respectively) in sequence to cover the semiconductor substrate (including the photodiode), and then a portion of the oxide layer and a portion of the poly gate are removed using a dry etching operation. When the dry etching operation is performed, the surface of the photodiode may be damaged accordingly.

Other conventional operations may also damage the surface of the photodiode. For example, a spacer may be formed on a sidewall of the aforementioned poly gate. In general, a silicon dioxide layer is first deposited by a chemical vapor deposition (CVD) process and is conformal to the conventional semiconductor substrate, and then the silicon dioxide layer is etched using an anisotropic etching process, thereby forming the "spacer" on the sidewall of the poly gate. A portion of the surface of the photodiode may be damaged by the anisotropic etching process. Therefore, the DC or WP performance may be poorer due to the damaged surface of the photodiode.

In view of the above, embodiments of the present disclosure provide a semiconductor device for a CIS device to sense light emitted to the front or back side of the CIS device by providing a transistor gate to cover a photodiode. The semiconductor device is disposed on a semiconductor substrate and includes an isolation feature, a photodiode and a transistor gate. The photodiode is adjacent to the isolation feature (such as trench isolation) and includes a first pinned photodiode with a first dopant type and a second pinned photodiode with a second dopant type. In some embodiments, the first pinned photodiode with the first doping type, such as an n-type pinned photodiode (NPPD), is first formed in the semiconductor substrate (such as a p-type semiconductor substrate) by implanting n-type dopant ions into the semiconductor substrate, and then the second pinned photodiode with a second doping type, such as an p-type pinned photodiode (PPPD), is formed and embedded in the NPPD by implanting p-type dopant ions into NPPD. After the photodiode is formed, the transistor gate are formed over the photodiode. Therefore, the photodiode is covered by a second portion of the transistor gate, and the surface of the photodiode will not be damaged by the aforementioned operations, such as the dry etching operation (when forming the transistor gate), or the anisotropic etching process (when forming the spacer).

In some embodiments, the aforementioned first/second portion of the transistor gate is implanted respectively by n-type and p-type doping ions. In general, a portion of the n-type and p-type doping ions in the first and second portions may diffuse into a third portion between the first portion and the second portion, and the portion of the n-type and p-type doping ions diffuse laterally toward the third portion to form PN junction. Therefore, the third portion may be used to electrically isolate the first portion from the second portion. In practice, the first portion may be used to control the operation of the semiconductor device by applying a transistor gate voltage. In some embodiments, the transistor gate voltage is greater than a threshold voltage of the semiconductor device to conduct a channel below the first portion, or the transistor gate voltage is kept at an off voltage in a range from about 0V to about −2V to close the channel. Further, the second portion and the PPPD have the same dopant type (p-type), and the second portion may be used to increase hole accumulations in the PPPD by applying a fixed negative biased voltage (such as in a range from about −0.3V to about −2V, and should not be greater than the off voltage applied on first portion by 0.5V).

FIG. 1A is a schematic cross-sectional diagram of showing a semiconductor device 100a in accordance with some embodiments. As shown in FIG. 1A, the semiconductor device 100a includes a semiconductor substrate 110, an isolation feature 120, a photodiode 130 and a transistor gate 140.

In some embodiments, the semiconductor substrate 110 is formed from such as silicon. Other commonly used materials, such as carbon, germanium, silicon-germanium, gallium, arsenic, nitrogen, indium, phosphorus, and/or the like, may also be included in the semiconductor substrate. The semiconductor substrate 110 may be formed from a single-crystalline semiconductor material or compound semiconductor materials, and may be a bulk substrate or a semiconductor-on-insulator (SOI) substrate.

In some embodiments, the isolation feature 120 including, such as a silicon oxide, a trench isolation, silicon dioxide or a field oxide (FOX), is disposed in the semiconductor substrate 110 for defining a pixel region 111 and a periphery region 112 of the semiconductor substrate 110. In some embodiments, some isolation features 120 may be shallow trench isolations (STIs) used to separate and isolate photo diodes, memory cells or SRAM cells in an array area, some isolation features 120 may be deep trench isolations used to separate and isolate NMOS and PMOS devices in a peripheral area, and some isolation features 120 may be junction isolations to isolate active elements. The structures, materials, depth of the STI and the deep trench isolations can be different in different areas. Specific STI profile and material may be needed for meeting certain device requirements.

The aforementioned photodiode 130 is disposed in the semiconductor substrate 110 and is adjacent to the isolation feature 120. The photodiode includes a first pinned photodiode (PPD) 131 with a first dopant type and a second PPD 132 with a second dopant type. The second dopant type is different from the first dopant type. In some embodiments, the first PPD 131, such as an n-type pinned photodiode (NPPD), is first formed in the semiconductor substrate 110 (such as a p-type semiconductor substrate) by implanting n-type doping ions (such as phosphorus or arsenic) into the semiconductor substrate 110. Then, the second PPD 132, such as a p-type pinned photodiode (PPPD), is formed and embedded in the NPPD by implanting p-type doping ions (such boron or gallium) into in a portion of the NPPD. Therefore, the NPPD and PPPD may form a p-n junction for transforming photons into electrons.

The transistor gate 140 (such as a transfer transistor or a reset transistor) is disposed over the photodiode 130. In some embodiments, because the transistor gate 140 is disposed over the photodiode 130, the operation of forming the transistor gate 140 may be performed after the operation of forming the photodiode 130. The transistor gate 140 includes a first portion 141 and a second portion 142. The first portion 141 with the first dopant type (such as n-type) is disposed on the semiconductor substrate 110 for controlling the operation of the semiconductor device 100a. Namely, the first portion 141 is on a channel region of the semiconductor substrate 110. The second portion 142 with the second dopant type is adjacent to the first portion 141, in which the second portion 142 covers the photodiode 130 and extends toward the isolation feature 120.

It is noted that the second portion 142 of the transistor gate 140 may prevent the surface of the photodiode 130 from being damaged by the subsequent operations, such as the dry etching operation (when forming the transistor gate). The second portion 142 of the transistor gate 140 is disposed on and covers the photodiode 130 completely. When the transistor gate 140 is formed using the drying etching operation, the second portion 142 of the transistor gate 140 on the photodiode 130 is not etched, such that the surface of the photodiode 130 is not damaged.

In some embodiments, the semiconductor device 100a may include a spacer 150 formed on a sidewall 140a of the transistor gate 140. In certain embodiments, a silicon dioxide layer 160 (which is formed together with the spacer 150) may be not totally removed. It is noted that, the second portion 142 of the transistor gate 140 may also be used to prevent the surface of the photodiode 130 from being damaged by such as the anisotropic etching process (when forming the spacer). The surface of the photodiode 130 is not damaged by the operation of forming the spacer 150, because the surface of the photodiode 130 is covered with the transistor gate 140.

In some embodiments, the semiconductor device 100a may include a first contact structure 180 and a second contact structure 181 electrically connected respectively to the first portion 141 and the second portion 142. For example, an inter layer dielectric (ILD) layer 170, such as formed from silicon oxide or borophosphosilicate glass (BPSG), is deposited to have a thickness in a range from about 300 nm to about 1300 nm using such as a low pressure chemical vapor deposition (LPCVD) process or a plasma enhanced chemical vapor deposition (PECVD) process. Then, a chemical mechanical polishing (CMP) procedure is used for planarization, thereby creating a smooth top surface topography for the ILD layer. Photolithographic and RIE processes, such as using $CHF_3$ as an etchant, may be used to form contact holes 170a and 170b in the ILD layer 170. Then, a metal material, such as formed from tungsten, aluminum, or copper, fills the contact holes 170a and 170b to the first contact structure 180 and the second contact structure 181.

In some embodiments, the first portion 141 may be used to control the operation of the semiconductor device by applying a transistor gate voltage through the first contact structure 180. In some embodiments, the transistor gate voltage is greater than a threshold voltage of the semiconductor device to conduct a channel below the first portion, or the transistor gate voltage is kept at an off voltage in a range from about 0V to about −2V to close the channel. In some embodiments, the second portion 142 and the PPPD have the same dopant type (p-type), and the second portion 142 may be used to increase hole accumulations by applying a negative biased voltage (such as in a range from about −0.3V to about −2V, and this voltage should not be greater than the off voltage applied on first portion 141 by 0.5V) through the second contact structure 181. In some embodiments, the semiconductor device 100a may include a drain region 190 and a lightly doped drain (LDD) layer 191, in which a silicide layer 192 is formed on the drain region 190 to increase the conductivity between the drain region 190 and a third contact structure 182. The third contact structure 182 may be formed using the same operation of forming the first contact structure 181 or the second contact structure 182.

Figure 1B:
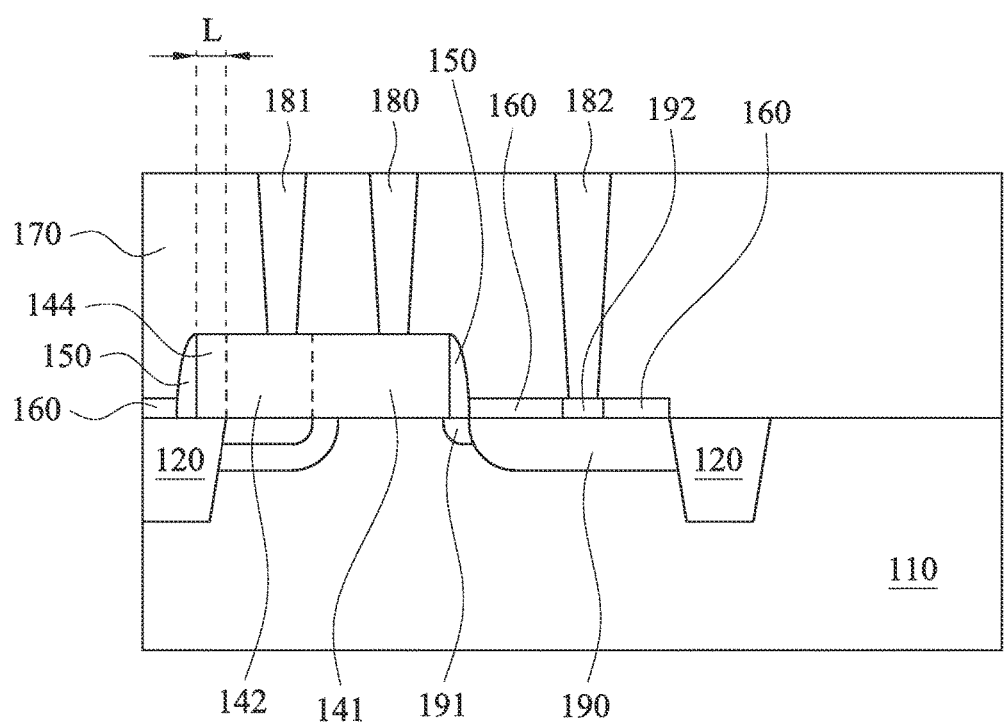
FIG. 1B is a schematic cross-sectional diagram of showing a semiconductor device in accordance with certain embodiments.

FIG. 1B is a schematic cross-sectional diagram of showing a semiconductor device 100b in accordance with certain embodiments. As shown in FIG. 1B, the semiconductor device 100b includes a semiconductor substrate 110, an isolation feature 120, a photodiode 130 and a transistor gate 140. In some embodiments, the semiconductor device 100b may further include a spacer 150, a silicon dioxide layer 160, an ILD layer 170, a first contact structure 180, a second contact structure 181, a third contact structure 182, a drain region 190, a LDD layer 191 and a silicide layer 192. The transistor gate 140 includes a first portion 141 and a second portion 142. The difference between the semiconductor device 100b in FIG. 1B and the semiconductor device 100b is that the second portion 142 of the semiconductor device 100b include an extended portion 144 extended from an interface 170 toward the isolation feature 120, in which the interface 170 is between the isolation feature 120 and the photodiode 130. Namely, the extending portion 144 is disposed on the isolation feature 120, such that the second portion 142 of the transistor gate 140 completely covers the photodiode 130. In some embodiments, the extending portion 144 with a length L greater than about 0 and smaller than or equal to about 300 nm. In certain embodiments, the aforementioned length L is in a range between about 10 nm and about 200 nm.

Figure 1C:
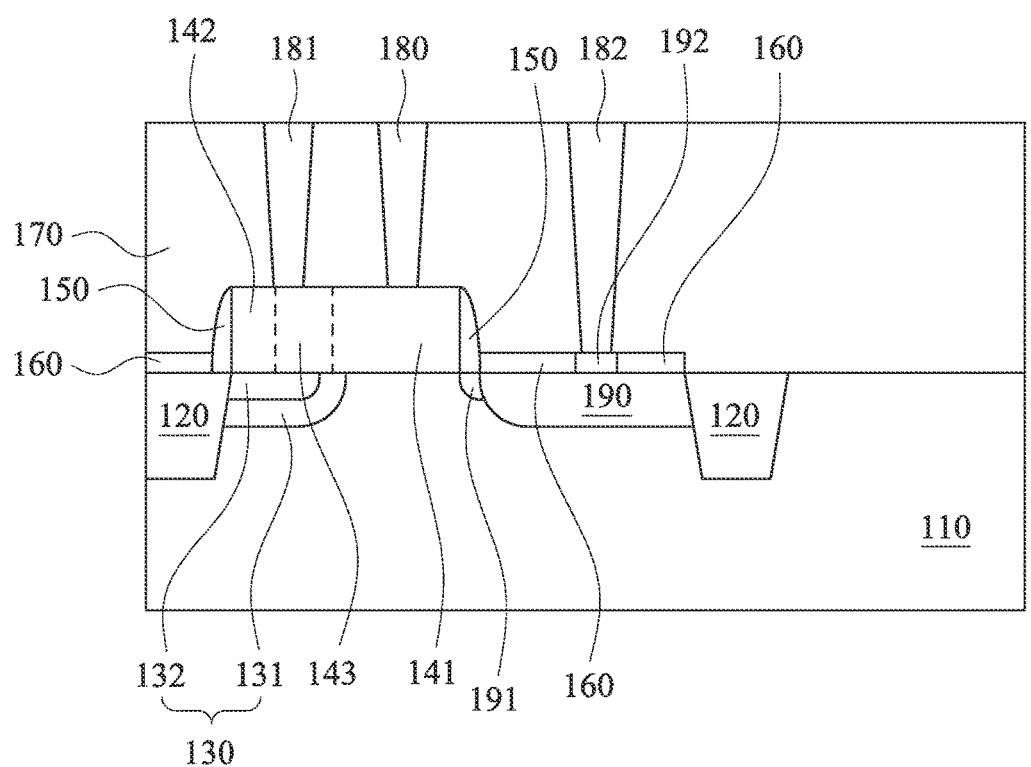
FIG. 1C is a schematic cross-sectional diagram of showing a semiconductor device in accordance with alternative embodiments.

FIG. 1C is a schematic cross-sectional diagram of showing a semiconductor device 100c in accordance with alternative embodiments. As shown in FIG. 1C, the semiconductor device 100c includes a semiconductor substrate 110, an isolation feature 120, a photodiode 130 and a transistor gate 140. In some embodiments, the semiconductor device 100b may further include a spacer 150, a silicon dioxide layer 160, an ILD layer 170, a first contact structure 180, a second contact structure 181, a third contact structure 182, a drain region 190, a LDD layer 191 and a silicide layer 192. The difference between the semiconductor device 100b in FIG. 1B and the semiconductor device 100b is that the transistor gate 140 of the semiconductor device 100c further includes a first portion 141, a second portion 142 and a third portion 143. The third portion 143 is between the first portion 141 and the second portion 142, thereby isolating electrically the first portion 141 from the second portion 142. For example, the aforementioned first/second portion 141/142 of the transistor gate 140 is implanted respectively by n-type/p-type doping ions. In general, after the operation of implanting the n-type/p-type doping ions, a heating process is performed to drive the n-type/p-type doping ions diffuse from the first/second portion 141/142 toward the third portion 143, and forms a PN junction which could isolate the first portion 141 and the second portion 142 if bias voltage applied on the second portion 142 is not greater than that applied on the first portion 141 by about 0.5V to keep PN junction reversely biased. It is mentioned that a silicide layer is not formed on the transistor gate 140 of the present disclosure, thereby preventing the first portion 141 from being electrically connected to the second portion 142. In some embodiments, the third portion 143 may be disposed on the second PPD 132, or the third portion 143 may be disposed on the first PPD 131 and on a portion of the second PPD 132.

Figure 2A:
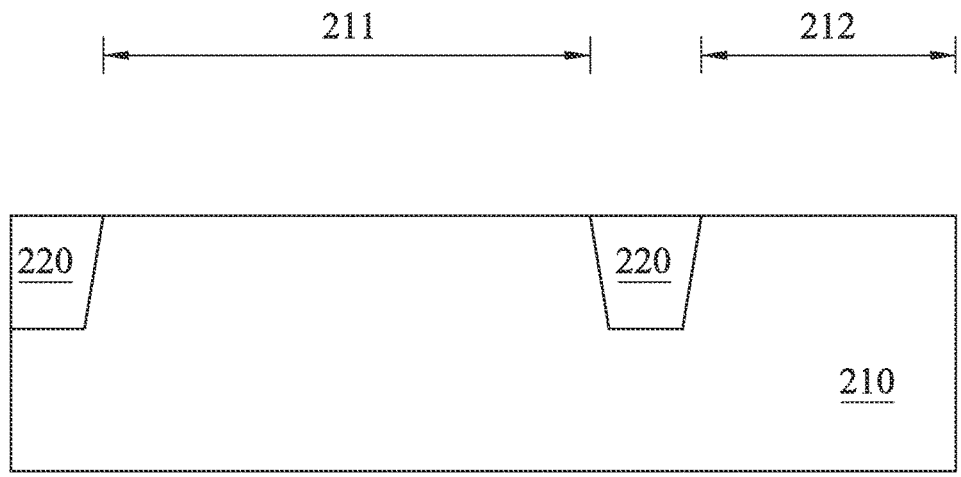
FIG. 2A-2D are schematic cross-sectional views of intermediate stages showing a method for fabricating a semiconductor device in accordance with some embodiments.

FIG. 2A-2D are schematic cross-sectional views of intermediate stages showing a method for fabricating a semiconductor device 200 in accordance with some embodiments. As shown in FIG. 2A, a semiconductor substrate 210 is provided and an isolation feature 220 is formed in the semiconductor substrate 210. In some embodiments, the semiconductor substrate 210 is formed from such as silicon. Other commonly used materials, such as carbon, germanium, silicon-germanium, gallium, arsenic, nitrogen, indium, phosphorus, and/or the like, may also be included in the semiconductor substrate. The semiconductor substrate 110 may be formed from a single-crystalline semiconductor material or compound semiconductor materials, and may be a bulk substrate or a semiconductor-on-insulator (SOI) substrate.

In some embodiments, the isolation feature 220 including, such as a silicon oxide, a trench isolation, silicon dioxide or a field oxide (FOX), is disposed in the semiconductor substrate 210 for defining a pixel region 211 and a periphery region 212 of the semiconductor substrate 210. In some embodiments, some isolation features 220 may be shallow trench isolations (STIs) used to separate and isolate photo diodes, memory cells or SRAM cells in an array area, and some isolation features 220 may be deep trench isolations used to separate and isolate NMOS and PMOS devices in a peripheral area. The structures, materials, depth of the STI and the deep trench isolations can be different in different areas. Specific STI profile and material may be needed for meeting certain device requirements.

Figure 2B:
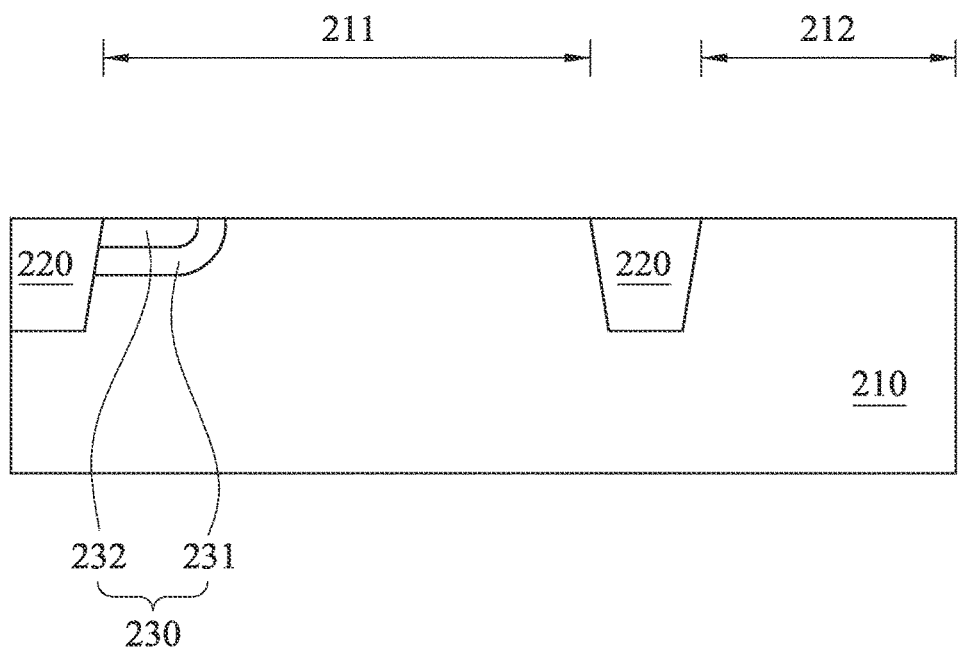

As shown in FIG. 2B, a photodiode 230 is formed and is adjacent to the isolation feature 220. The photodiode 230 is disposed in the semiconductor substrate 210 and includes a first pinned photodiode (PPD) 231 with a first dopant type and a second PPD 232 with a second dopant type. The second dopant type is different from the first dopant type. In some embodiments, the first PPD 231, such as an n-type pinned photodiode (NPPD), is first formed in the semiconductor substrate 210 (such as a p-type semiconductor substrate) by implanting n-type doping ions (such as phosphorus or arsenic) into the semiconductor substrate 210. Then, the second PPD 232, such as a p-type pinned photodiode (PPPD), is formed and embedded the NPPD by implanting p-type doping ions (such boron or gallium) into in a portion of the NPPD. Therefore, the NPPD and PPPD may form a p-n junction for transforming photos into electrons.

In some embodiments, the first PPD 231 is formed in the semiconductor substrate 210 using an implanting process at an energy in a range from about 20 KeV to about 200 KeV, at a dose concentration in a range from about $1 \times 10^{16}$ to $5 \times 10^{18}$ atoms/cm$^3$. In certain embodiments, the second 232 is embedded in the first PPD 231 using an implanting process at an energy in a range from about 5 KeV to about 50 KeV, at a dose concentration in a range from about $5 \times 10^{16}$ to $1 \times 10^{19}$ atoms/cm$^3$.

Figure 2C:
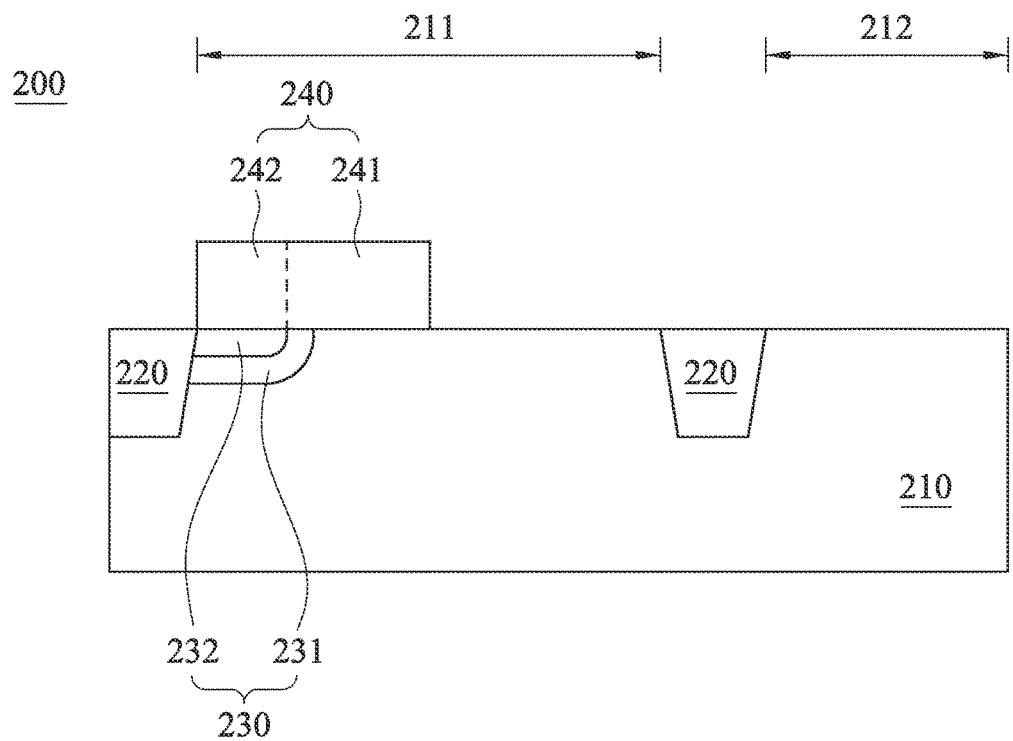
Figure 2D:
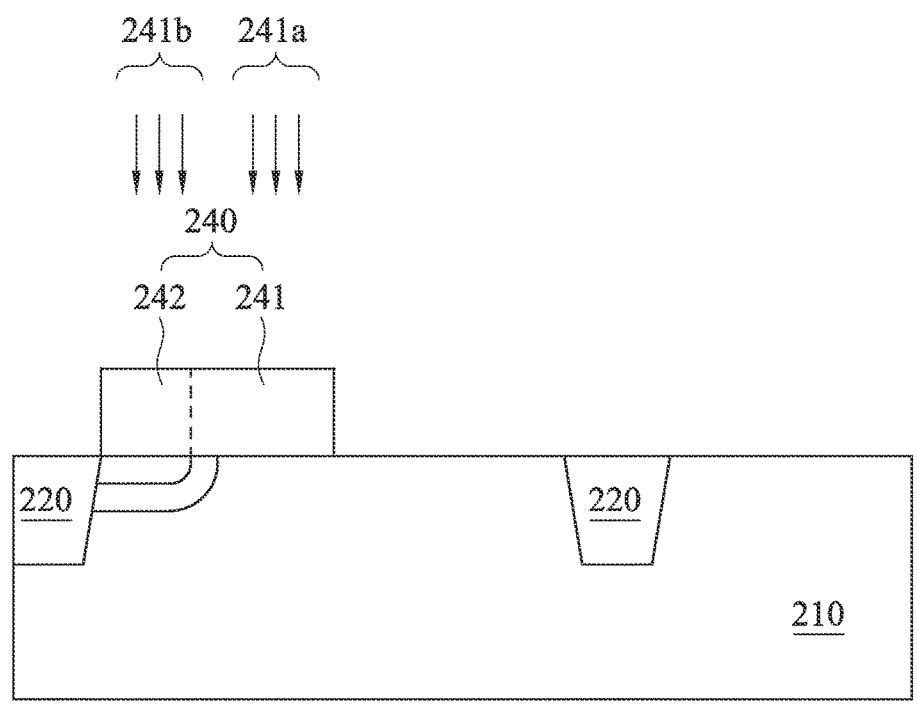

As shown in FIG. 2C, a transistor gate 240 (such as a transfer transistor or a reset transistor) is disposed over the photodiode 230. In some embodiments, because the transistor gate 240 is disposed over the photodiode 230, the operation of forming the transistor gate 240 may be performed after the operation of forming the photodiode 230. The transistor gate 240 includes a first portion 241 and a second portion 242. The first portion 241 with the first dopant type (such as n-type) is disposed on the semiconductor substrate 210 for controlling the operation of the semiconductor device 200. Namely, the first portion 241 is on a channel region of the semiconductor substrate 210. The second portion 242 with the second dopant type is adjacent to the first portion 241, in which the second portion 242 covers the photodiode 230 and extends toward the isolation feature 220. As shown in FIG. 2D, in some embodiments, the first portion 241 of the transistor gate 240 may be implanted by first doping ions 241a with the first dopant type, at a doping concentration with the first dopant type in a range from about $10^{18}$ atoms/cm$^3$ to about $10^{21}$ atoms/cm$^3$, thereby having the first dopant type. In certain embodiments, the second portion 242 of the transistor gate 240 may be implanted by second doping ions 241b at a doping concentration with the second dopant type in a range from about $10^{18}$ atoms/cm$^3$ to about $10^{21}$ atoms/cm$^3$, thereby having the second dopant type.

It is noted that the second portion 242 of the transistor gate 240 may prevent the surface of the photodiode 230 from being damaged by the subsequent operations, such as the dry etching operation (when forming the transistor gate). The second portion 242 of the transistor gate 240 is disposed on and covers the photodiode 230 completely. When the transistor gate 240 is formed using the drying etching operation, the second portion 242 of the transistor gate 240 on the photodiode 230 is not etched, such that the surface of the photodiode 230 is not damaged.

Figure 3A:
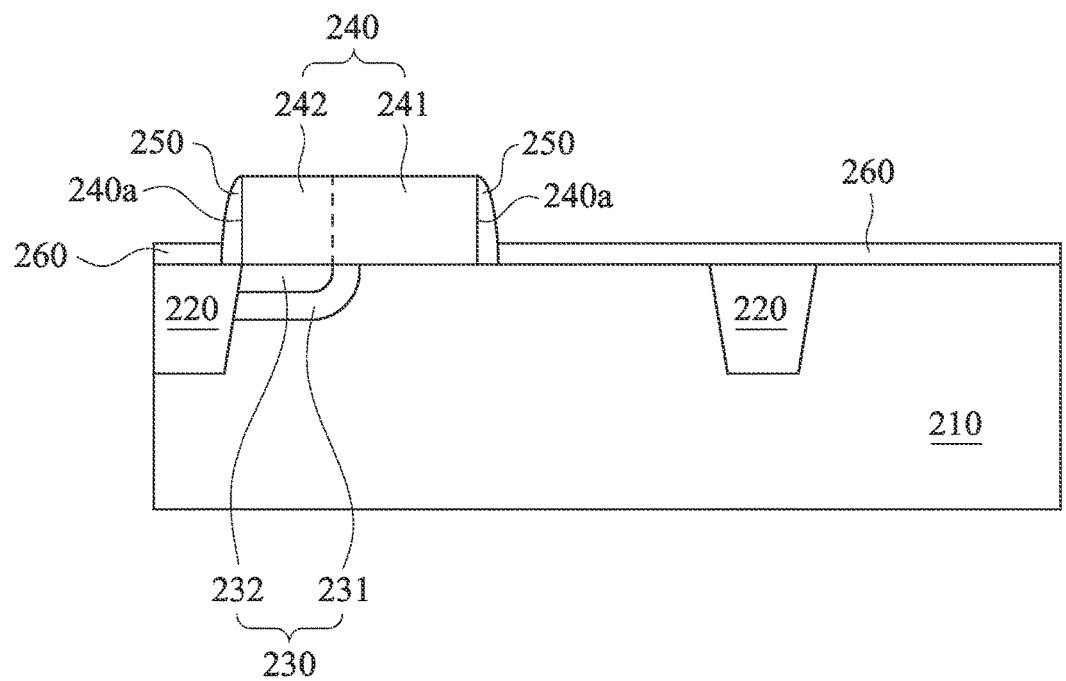
FIG. 3A is a schematic cross-sectional diagram showing a semiconductor device in FIG. 2C, which the semiconductor device includes a spacer and a silicon dioxide layer in accordance with certain embodiments.

FIG. 3A is a schematic cross-sectional diagram showing a semiconductor device 200 in FIG. 2C, in which the semiconductor device 200 has a spacer 250 and a silicon dioxide layer 260 in accordance with certain embodiments. As shown in FIG. 3A, the semiconductor device 200 may aforementioned second portion 242 of the transistor gate 240 may also be used to prevent the surface of the photodiode from being damaged by such as the anisotropic etching process (when forming the spacer). In detail, a spacer 250 is formed on a sidewall 240a of the transistor gate 240. The surface of the photodiode 230 is not damaged by the operation of forming the spacer 250, because the surface of the photodiode 230 is covered with the transistor gate 240.

Figure 3B:
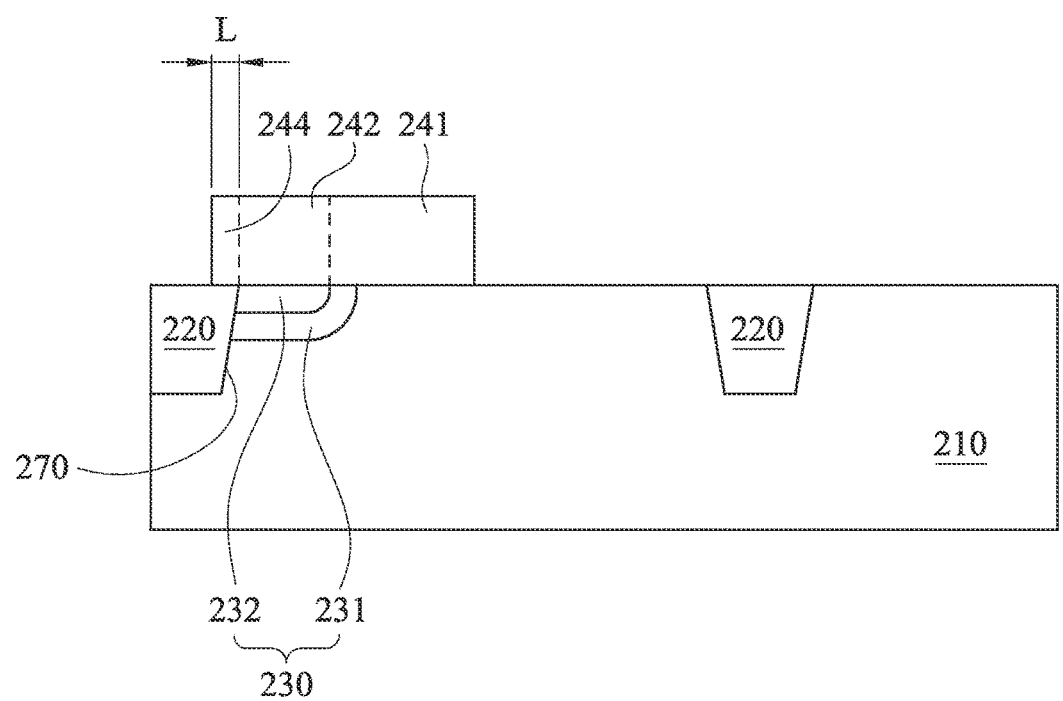
FIG. 3B is a schematic cross-sectional diagram showing a semiconductor device in FIG. 2C, which a second portion of the semiconductor device further includes an extended portion in accordance with some embodiments.

FIG. 3B is a schematic cross-sectional diagram showing a semiconductor device 200 in FIG. 2C, in which a second portion of the semiconductor device further includes an extended portion 244 in accordance with some embodiments. As shown in FIG. 3B, in some embodiments, the second portion 242 of the transistor gate 240 includes an extending portion 244 extended from an interface 270 toward the isolation feature 220, in which the interface 270 is between the isolation feature 220 and the photodiode 230. Namely, the extending portion 244 is disposed on the isolation feature 220, such that the second portion 242 of the transistor gate 240 completely covers the photodiode 230. In some embodiments, the extending portion 244 with a length L greater than about 0 and smaller than or equal to about 300 nm. In certain embodiments, the aforementioned length L is in a range between about 10 nm and about 200 nm.

Figure 3C:
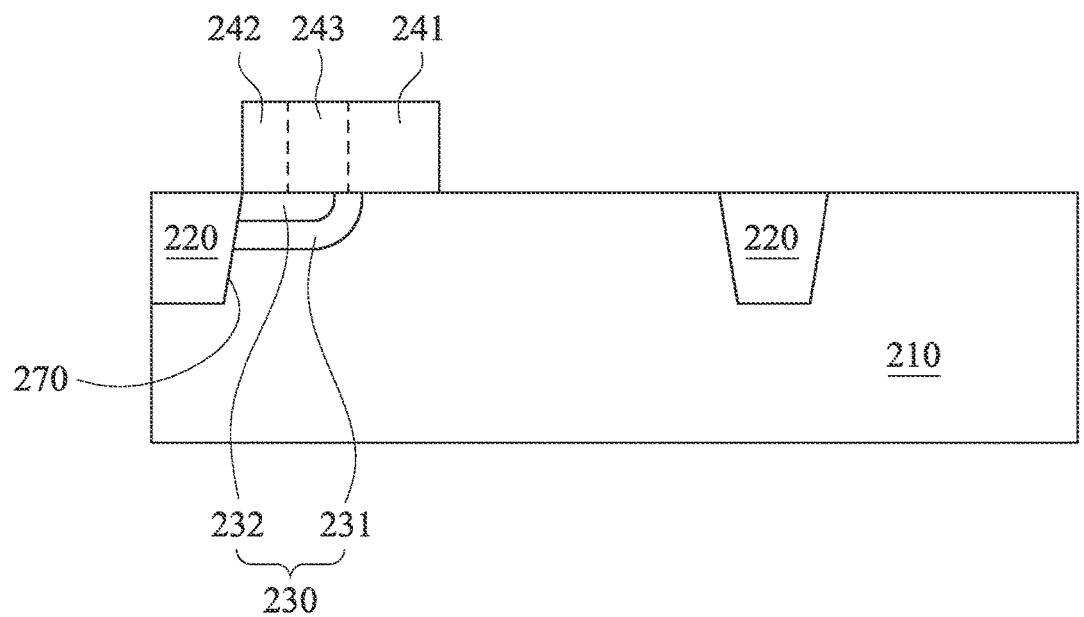
FIG. 3C is a schematic cross-sectional diagram showing a semiconductor device in FIG. 2C, in which a transistor gate of the semiconductor device further includes a third portion in accordance with some embodiments.

FIG. 3C is a schematic cross-sectional diagram showing a semiconductor device 200 in FIG. 2C, in which a transistor gate 240 of the semiconductor device 200 further includes a third portion 243 in accordance with some embodiments. As shown in FIG. 3C, the transistor gate 240 may include a third portion 243 between the first portion 241 and the second portion 242 for isolating electrically the first portion 241 from the second portion 242. For example, the aforementioned first/second portion 241/242 of the transistor gate 240 is implanted respectively by n-type/p-type doping ions. In general, after the operation of implanting the n-type/p-type doping ions, a heating process is performed to drive the n-type/p-type doping ions diffuse from the first/second portion 241/242 toward the third portion 243, and forms a PN junction which could isolate the first portion 241 and the second portion 242 if bias voltage applied on the second portion 242 is not greater than that applied on the first portion 241 by about 0.5V to keep PN junction reversely biased. It is mentioned that a silicide layer is not formed on the transistor gate 240 of the present disclosure, thereby preventing the first portion 241 from being electrically connected to the second portion 242.

Figure 4:
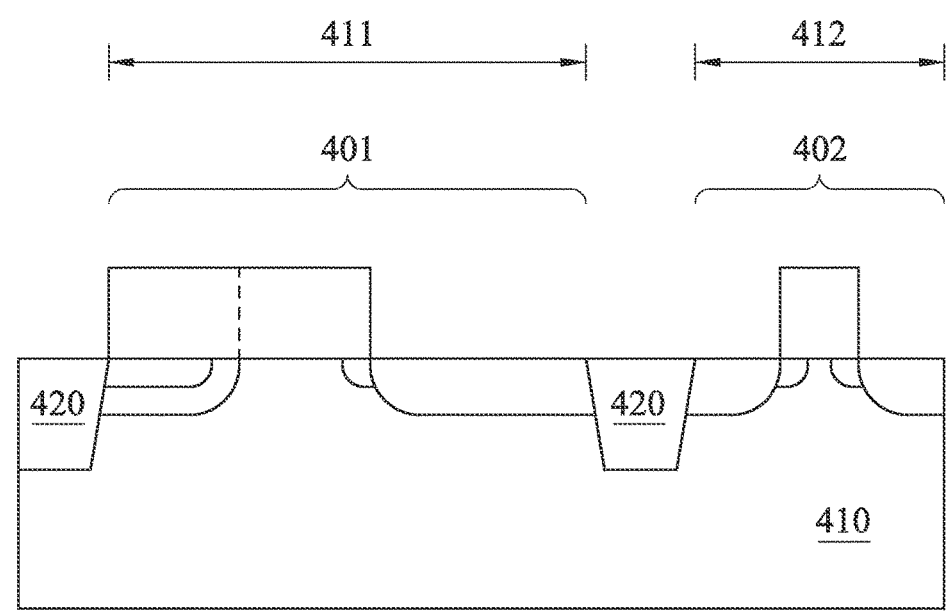
FIG. 4 is a schematic cross-sectional diagram showing an image sensor device in accordance with some embodiments.

FIG. 4 is a schematic cross-sectional diagram showing an image sensor device 400 in accordance with some embodiments. As shown in FIG. 4, the image sensor device 400 includes a semiconductor substrate 410, an isolation feature 420 and a semiconductor device 401, which are similar to the semiconductor substrate 110, the isolation feature 120 and the semiconductor device 100 respectively. The isolation feature 420 is used to define a pixel region 411 and a periphery region 412 of the semiconductor substrate 410. The semiconductor device 401 is disposed in the pixel region 411. The image sensor device 400 further includes a logic circuit 402 disposed in the periphery region 412. It is mentioned that, the logic circuit 402 may be fabricated using the same CMOS process sequences used for the semiconductor device 401.

Figure 5:
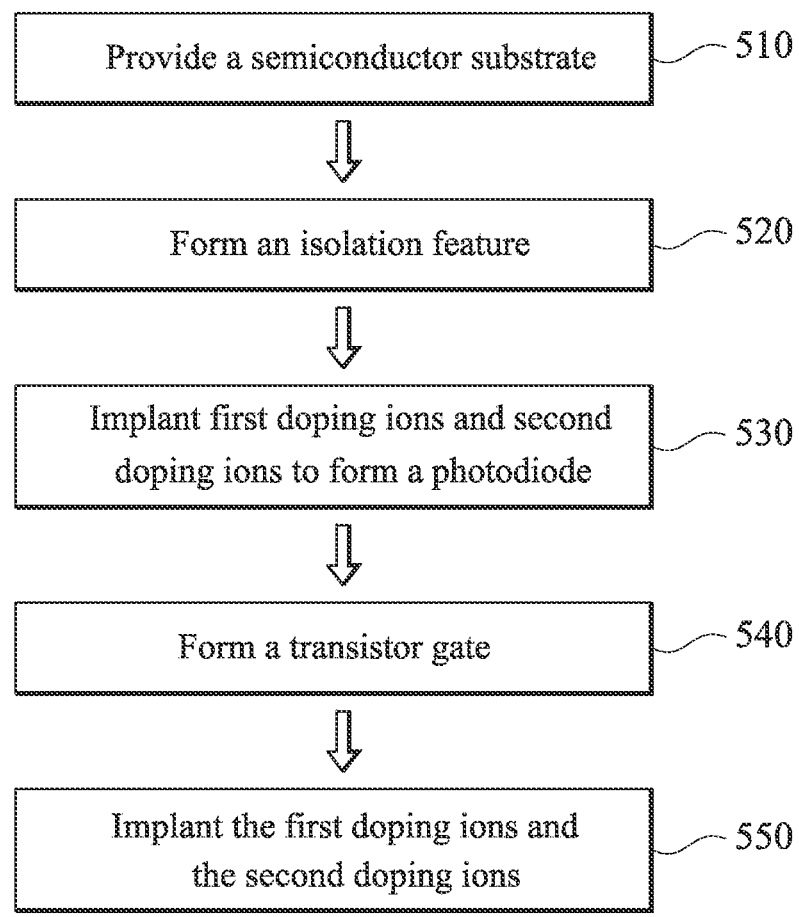
FIG. 5 is a flow chart of a method for fabricating a semiconductor device in accordance with various embodiments.

Referring to FIG. 5 together with FIG. 2A-FIG. 2D, FIG. 5 is a flow chart of a method 500 for fabricating a semiconductor device 200 on a semiconductor substrate 210. The method 500 begins at operation 510, where a semiconductor substrate 210 is provided. At operation 520, an isolation 220 feature is formed in the semiconductor substrate 210, as shown in FIG. 2A. At operation 530, first doping ions with a first dopant type are implanted into the semiconductor substrate 210 to form a first pinned photodiode 231 and second doping ions with a second dopant type are implanted into a portion of the first pinned photodiode 231 to form a second pinned photodiode 232 embedded in the first pinned photodiode 231, in which the first pinned photodiode 231 is together with the second pinned photodiode 232 to form a photodiode 230, as shown in FIG. 2B. At operation 540, a transistor gate 240 is formed over the photodiode 230, in which the transistor gate 240 has a first portion 241 and a second portion 242 adjacent to the first portion 241, in which the second portion 242 covers the photodiode 230 and extends towards the isolation feature 220, as shown in FIG. 2C. At operation 550, the first doping ions and the second doping ions are implanted respectively into the first portion 241 and the second portion 242.

In accordance with some embodiments, the present disclosure discloses a semiconductor device. The semiconductor device includes a semiconductor substrate, an isolation feature, a photodiode and a transistor gate. The isolation feature is disposed in the semiconductor substrate. The photodiode is disposed in the semiconductor substrate and adjacent to the isolation feature. The photodiode includes a first pinned photodiode and a second pinned photodiode. The first pinned photodiode has a first dopant type. The second pinned photodiode with a second dopant type is embedded in the first pinned photodiode, in which the second dopant type is different from the first dopant type. The transistor gate is disposed over the photodiode. The transistor gate includes a first portion and a second portion. The first portion with the first dopant type is used for controlling the operation of the semiconductor device. The second portion with the second dopant type is adjacent to the first portion, in which the second portion covers the photodiode and extends towards the isolation feature.

In accordance with certain embodiments, the present disclosure discloses an image sensor device. The image sensor device includes a semiconductor substrate, an isolation feature, a logic circuit and a semiconductor device. The isolation feature is disposed in the semiconductor substrate to define a pixel region and a periphery region of the semiconductor substrate. The semiconductor device is disposed in the pixel region. The semiconductor device includes a photodiode and a transistor gate. The photodiode is disposed in the semiconductor substrate and adjacent to the isolation feature. The photodiode includes a first pinned photodiode and a second pinned photodiode. The first pinned photodiode has a first dopant type. The second pinned photodiode with a second dopant type is embedded in the first pinned photodiode, in which the second dopant type is different from the first dopant type. The transistor gate is disposed over the photodiode. The transistor gate includes a first portion and a second portion. The first portion has the first dopant type for controlling the operation of the semiconductor device. The second portion with the second dopant type is adjacent to the first portion, in which the second portion covers the photodiode and extends towards the isolation feature. The logic circuit is disposed in the periphery region.

In accordance with alternative embodiments, the present disclosure discloses a method for fabricating a semiconductor device. In this method, a semiconductor substrate is provided. An isolation feature is formed in the semiconductor substrate. First doping ions with a first dopant type are implanted into the semiconductor substrate to form a first pinned photodiode. Second doping ions with a second dopant type are implanted into a portion of the first pinned photodiode to form a second pinned photodiode embedded in the first pinned photodiode, in which the first pinned photodiode is together with the second pinned photodiode to form a photodiode. A transistor gate is formed over the photodiode, in which the transistor gate has a first portion and a second portion adjacent to the first portion, in which the second portion covers the photodiode and extends towards the isolation feature. The first doping ions and the second doping ions are respectively into the first portion and the second portion.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a semiconductor substrate;
    an isolation feature disposed in the semiconductor substrate;
    a photodiode disposed in the semiconductor substrate and adjacent to the isolation feature, the photodiode comprising:
        a first pinned photodiode with a first dopant type; and
        a second pinned photodiode with a second dopant type embedded in the first pinned photodiode, wherein the second dopant type is different from the first dopant type; and
    a transistor gate disposed over the photodiode, the transistor gate comprising:
        a first portion with the first dopant type disposed on a channel region of the semiconductor substrate for controlling the operation of the semiconductor device, wherein an orthogonal projection of the first portion onto a top surface of the semiconductor substrate overlaps with a first interface between the first Dinned photodiode and the channel region of the semiconductor substrate;
        a second portion with the second dopant type, wherein the second portion covers the photodiode and extends towards the isolation feature without covering the channel region, and the transistor gate completely covers the photodiode; and
        a third portion disposed between the first portion and the second portion for isolating electrically the first portion from the second portion, wherein the third portion is disposed on the first pinned photodiode and on a portion of the second pinned photodiode,
    wherein the first portion is electrically isolated from the second portion.

2. The device of claim 1, wherein the second portion of the transistor gate comprises an extending portion extended from a second interface toward the isolation feature, wherein the second interface is between the isolation feature and the photodiode.

3. The device of claim 2, wherein the extending portion has a length greater than about 0 nanometers and smaller than or equal to about 300 nanometers.

4. The device of claim 2, wherein the extending portion has a length substantially in a range between about 10 nanometers and about 200 nanometers.

5. The device of claim 1, further comprising a first contact structure and a second contact structure electrically connected respectively to the first portion and the second portion.

6. The device of claim 1, wherein the first portion of the transistor gate has a doping concentration with the first dopant type substantially in a range from about $10^{18}$ atoms/cm$^3$ to about $10^{21}$ atoms/cm$^3$.

7. The device of claim 1, wherein the second portion of the transistor gate has a doping concentration with the second dopant type substantially in a range from about $10^{18}$ atoms/cm$^3$ to about $10^{21}$ atoms/cm$^3$.

8. The device of claim 1, wherein a transistor gate voltage is applied on the first portion, and a fixed negative biased voltage is applied on the second portion,
    wherein the transistor gate voltage is at an off voltage when a channel in the channel region is closed, and the fixed negative biased voltage is not greater than the off voltage by 0.5 volts.

9. An image sensor device comprising:
    a semiconductor substrate;
    an isolation feature disposed in the semiconductor substrate to define a pixel region and a periphery region of the semiconductor substrate;
    a semiconductor device disposed in the pixel region, the semiconductor device comprising:
    a photodiode disposed in the semiconductor substrate and adjacent to the isolation feature, the photodiode comprising:
        a first pinned photodiode with a first dopant type; and
        a second pinned photodiode with a second dopant type embedded in the first pinned photodiode, wherein the second dopant type is different from the first dopant type, wherein the first pinned photodiode and the second pinned photodiode abut the isolation feature;

a transistor gate disposed over the photodiode, the transistor gate comprising:

a first portion with the first dopant type disposed on a channel region of the semiconductor substrate for controlling the operation of the semiconductor device;

a second portion with the second dopant type, wherein the second portion covers the photodiode and extends towards the isolation feature without covering the channel region, and the transistor gate completely covers the photodiode; and a third portion disposed between the first portion and the second portion for isolating electrically the first portion from the second portion, wherein the third portion is disposed on the first pinned photodiode and on a portion of the second pinned photodiode, wherein the first portion is electrically isolated from the second portion; and a logic circuit disposed in the periphery region.

10. The device of claim 9, wherein the second portion of the transistor gate comprises an extending portion extended from an interface toward the isolation feature, wherein the interface is between the isolation feature and the photodiode.

11. The device of claim 10, wherein the extending portion has a length greater than about 0 nanometers and smaller than or equal to about 300 nanometers.

12. The device of claim 9, further comprising a first contact structure and a second contact structure electrically connected respectively to the first portion and the second portion.

13. A method for fabricating a semiconductor device, the method comprising:

providing a semiconductor substrate;

forming an isolation feature in the semiconductor substrate;

implanting first doping ions with a first dopant type into the semiconductor substrate to form a first pinned photodiode; and implanting second doping ions with a second dopant type into a portion of the first pinned photodiode to form a second pinned photodiode embedded in the first pinned photodiode, wherein the first pinned photodiode is together with the second pinned photodiode to form a photodiode, and the first pinned photodiode and the second pinned photodiode abut the isolation feature;

forming a transistor gate over the photodiode, wherein the transistor gate has a first portion disposed on a channel region of the semiconductor substrate, a second portion, and a third portion disposed between the first portion and the second portion for isolating electrically the first portion from the second portion, wherein the second portion covers the photodiode and extends towards the isolation feature without covering the channel region, and the transistor gate completely covers the photodiode, wherein the third portion is disposed on the first pinned photodiode and on a portion of the second pinned photodiode, wherein the first portion is electrically isolated from the second portion; and implanting the first doping ions and the second doping ions respectively into the first portion and the second portion.

14. The method of claim 13, wherein the operation of forming the transistor gate is performed after the operation of implanting the second doping ions.

15. The method of claim 13, wherein the operation of forming the transistor gate forms the second portion comprising an extending portion extended from an interface toward the isolation feature, wherein the interface is between the isolation feature and the photodiode.

16. The method of claim 15, wherein the operation of forming the extending portion forms the extending portion with a length greater than about 0 nanometers and smaller than or equal to about 300 nanometers.

17. The method of claim 13, further comprising:

forming a first contact structure and a second contact structure electrically connected respectively to the first portion and the second portion.

18. The method of claim 13, wherein the operation of implanting the first and second doping ions respectively into the first and second portions of the transistor gate comprises heating the first and second portions to drive the first and second doping ions diffuse from the first and second portions toward the third portion, and forming a PN junction.

19. The method of claim 13, wherein the operation of forming the transistor gate comprises forming the first portion of the transistor gate with a doping concentration with the first dopant type substantially in a range from $10^{18}$ atoms/cm$^3$ to $10^{21}$ atoms/cm$^3$.

20. The method of claim 13, wherein the operation of forming the transistor gate comprises forming the second portion of the transistor gate with a s doping concentration with the second dopant type substantially in a range from $10^{18}$ atoms/cm$^3$ to $10^{21}$ atoms/cm$^3$.

* * * * *